(12) United States Patent
Shigenaka et al.

(10) Patent No.: US 7,193,211 B2
(45) Date of Patent: Mar. 20, 2007

(54) THERMAL TYPE INFRARED RAY IMAGING DEVICE AND FABRICATION METHOD THEREOF

(75) Inventors: Keitaro Shigenaka, Tokyo-to (JP); Naoya Mashio, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/352,339

(22) Filed: Feb. 13, 2006

(65) Prior Publication Data

US 2006/0131506 A1    Jun. 22, 2006

Related U.S. Application Data

(63) Continuation of application No. 10/393,259, filed on Mar. 21, 2003.

(30) Foreign Application Priority Data

Mar. 22, 2002   (JP) ............................ 2002-80066

(51) Int. Cl.
    *H01L 25/00*   (2006.01)
(52) U.S. Cl. ....................................... 250/332
(58) Field of Classification Search ................. 250/332
    See application file for complete search history.

(56) References Cited

U.S. PATENT DOCUMENTS 4,791,005 A    12/1988   Becker et al.
4,791,296 A    12/1988   Carpio
5,981,950 A    11/1999   Wolny et al.
6,031,231 A    2/2000    Kimata et al.

FOREIGN PATENT DOCUMENTS

| JP | 4-234170 | 8/1992 |
|---|---|---|
| JP | 8/201177 | 8/1996 |
| JP | 9/232616 | 9/1997 |
| JP | 10-209418 | 8/1998 |
| JP | 2000-188407 | 7/2000 |
| JP | 2000-205944 | 7/2000 |
| JP | 2001-201400 | 7/2001 |

*Primary Examiner*—David Porta
*Assistant Examiner*—Shun Lee
(74) *Attorney, Agent, or Firm*—Oblon, Spivak, McClelland, Maier & Neustadt, P.C.

(57) ABSTRACT

A fabrication method of a thermal type infrared ray imaging device that includes forming a plurality of diodes in a single crystal silicon layer as first and second thermoelectric conversion parts constituting a thermoelectric conversion part; forming input and output wirings to be connected to a plurality of cells; forming a plurality of opening portions which expose the single crystal silicon substrate; forming a first photothermal conversion layer; and removing selectively a portion of the single crystal silicon substrate via the plurality of opening portions.

19 Claims, 12 Drawing Sheets

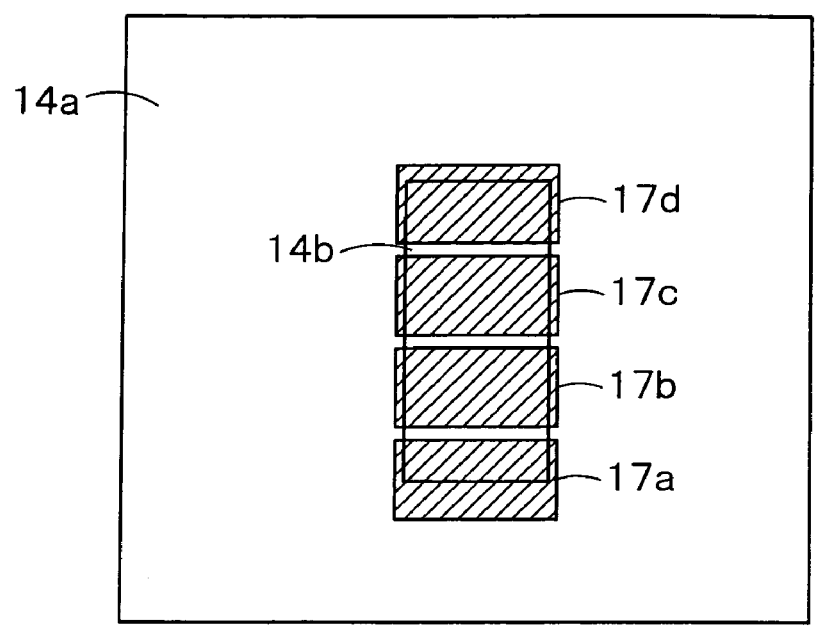
F I G. 3A
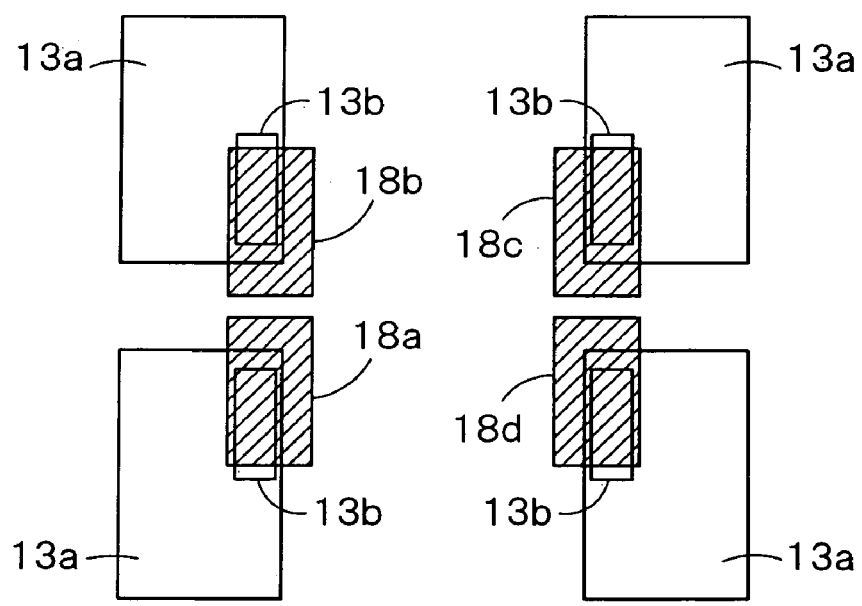
F I G. 3B

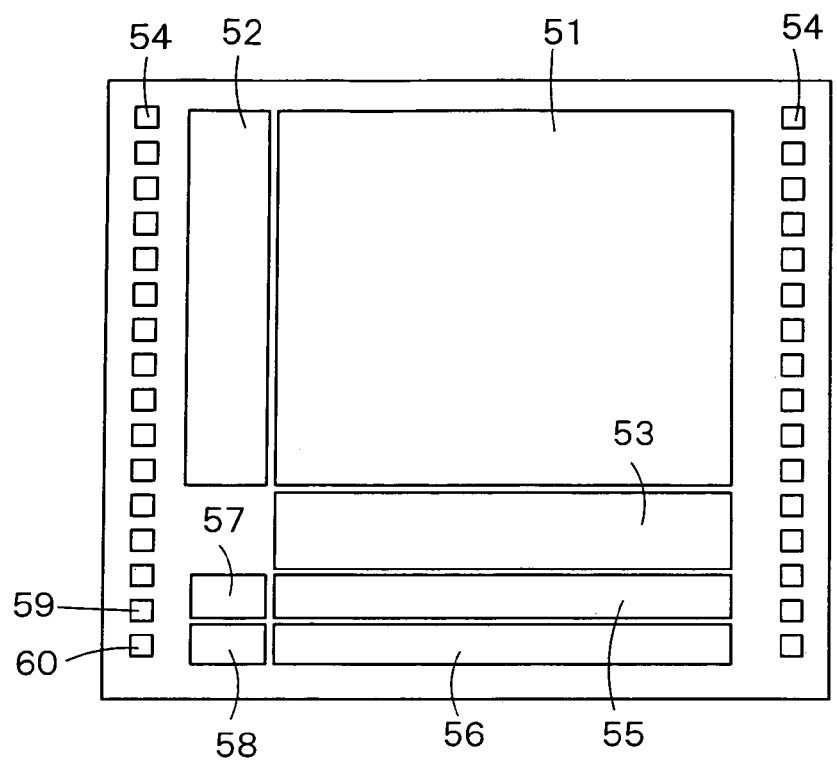
F I G. 4
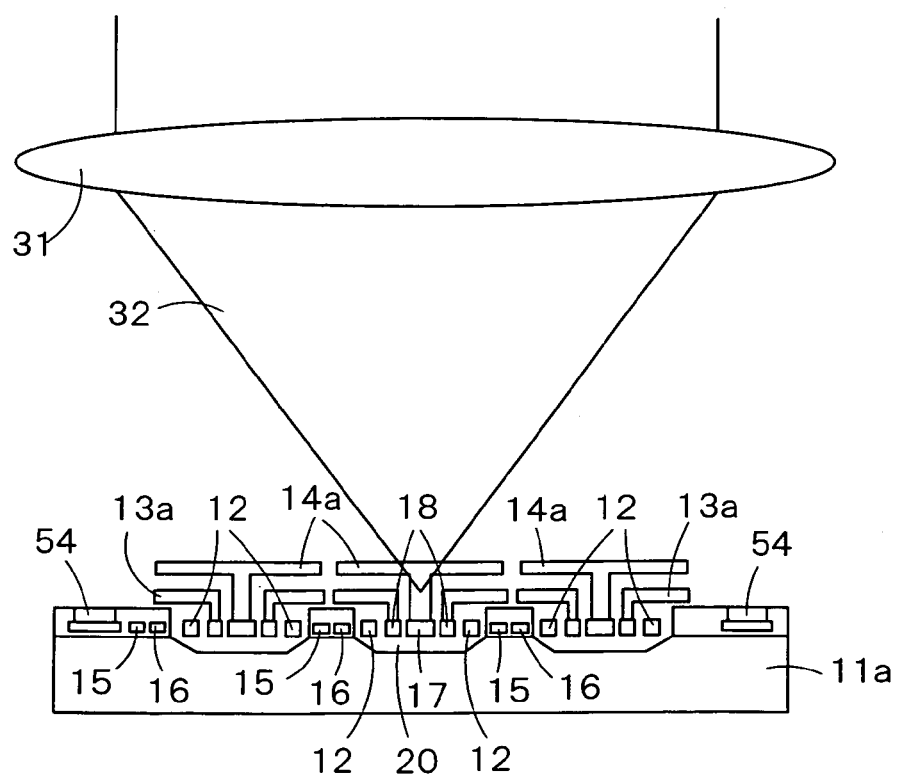
F I G. 5

THERMAL TYPE INFRARED RAY IMAGING DEVICE AND FABRICATION METHOD THEREOF

CROSS REFERENCE TO RELATED APPLICATIONS

This application is a Continuation of U.S. patent application Ser. No. 10/393,259, filed Mar. 21, 2003, and is based upon and claims the benefit of priority from the prior Japanese Patent Applications No. 2002-80066, filed on Mar. 22, 2002. The entire contents of these applications are incorporated herein by reference.

BACKGROUND OF THE INVENTION

1. Field of the Invention

The present invention relates to a thermal type infrared ray imaging device and a fabrication method thereof in which a plurality of cells are provided for each pixel.

2. Related Background Art

Recently, as a thermal type infrared ray image sensor in which a cooling apparatus is unnecessary, a bolometer type made of vanadium oxide using a micromachine technique and a pyroelectric type made of BST (Barium-Strontium-Titanate) type have been sold commercially. These products has a heat sensitive part for absorbing infrared ray to raise temperature, a support leg for thermally separating the heat sensitive part from a silicon substrate, a horizontal address line for selecting pixels, and a vertical signal line.

This type of infrared ray image sensor absorbs the infrared ray radiated from objects at the heat sensitive part, and detects temperature rise of the heat sensitive part by resistance variation and capacitance variation. Because of this, the support pillar for supporting the heat sensitive part has a structure in which cross section is small and length is long, in order to enhance adiabatic effect.

However, when the length of the support leg is long, the infrared ray is absorbed to convert the infrared ray into heat, thereby decreasing area of the heat sensitive part for converting the heat into an electric signal. That is, the length of the support leg and the area of the heat sensitive part are trade-off.

When the area of the heat sensitive part decreases, dead area of image area increases. When a picture of a faraway small object is taken, a spot focused on an image area becomes about 14 µm of diffraction limit. Because of this, when this spot of 14 µm is focused on non-sensitive area, no picture can be taken. Accordingly, as shown in FIG. 24, Japanese patent Laid-open publication No. 209418/1998 and so on disclose a structure in which a heat sensitive part 123 is divided into a photothermal conversion part 125 and a heat sensitive conversion part 124, and area of the heat sensitive conversion part 125 is enlarged. In FIG. 24, reference number 121 is a substrate, reference number 122 is a bonding pad, reference number 126 is a hollow part, reference number 127 is a support leg for supporting the heat sensitive part 123 on the substrate 121, reference number 128 is a vertical signal line.

It is possible to estimate emissivity of an object under test, by measuring intensity of a plurality of infrared rays radiated from the objects. Therefore, it is possible to easily identify materials, and to precisely measure absolute temperature. A method of performing the entire processings by image is disclosed in Japanese Laid-open publication No. 23261/1997 and Japanese Laid-open publication No. 188407/2000. A cooling type image sensor of HgCdTe or GaAlAs/GsAs system quantum well structure type is used in these documents. The sensor has a feature in which it is possible to easily obtain lamination structure, and an absorption waveband is very narrow. It is possible to selectively absorb the infrared ray of each waveband in each layer of the lamination layer.

However, in a non-cooling type infrared ray image sensor, for example, Japanese application No. 201400/2001 discloses a method in which detection pixels of two wavelengths are alternately disposed for every line or every column. In the sensor disclosed in this document, a non-sensitive area increases at each waveband, and it becomes difficult to take a picture of a faraway small object.

Conventionally, it is possible to estimate emissivity of the object under test by measuring a plurality of infrared rays emitted from objects. Therefore, it is possible to identify a material of the object under test, and to precisely measure the absolute temperature. However, there was a problem in which the non-sensitive area at each waveband increases, and it became difficult to take a picture of the faraway small object.

SUMMARY OF THE INVENTION

An object of the present invention is to provide a thermal type infrared ray imaging device and a fabrication method thereof capable of obtaining excellent imaging properties by preventing increase of the non-sensitive area at each waveband.

In order to achieve the foregoing object, a thermal type infrared ray imaging device, comprising:

a plurality of cells arranged on a substrate each having a photothermal conversion part which converts an infrared ray into heat, and a thermoelectric conversion part which is provided below said photothermal conversion part and which converts the heat generated by said photothermal conversion part into an electric signal;

a selection part which selects some cells among said plurality of cells; and an output part which outputs the electric signal generated by said thermoelectric conversion part of each of the selected cells, wherein said photothermal conversion part includes:

a first photothermal conversion layer; and a second photothermal conversion layer provided over and apart from said first photothermal conversion layer, which converts an infrared ray within a waveband different from a waveband of said first photothermal conversion layer into heat, wherein said thermoelectric conversion part includes:

a first thermoelectric conversion part which converts the heat generated by said first photothermal conversion layer into the electric signal; and a second thermoelectric conversion part which is thermally separated from said first thermoelectric conversion part, and which converts the heat generated by said second photothermal conversion layer into the electric signal.

Furthermore, a thermal type infrared ray imaging device, comprising:

a plurality of cells arranged on a substrate each having a photothermal conversion part which converts an incident infrared ray into heat, and a thermoelectric conversion part which is provided below said photothermal conversion part and which converts the heat generated by said photothermal conversion part into an electric signal;

a selection part which selects some cells among said plurality of cells; and an output part which outputs the electric signal generated by said thermoelectric conversion part of each of the selected cells;

wherein said photothermal conversion part has a plurality of photothermal conversion layers which convert infrared rays within different wavebands into heat, said photothermal conversion layers being disposed apart from each other in a vertical direction; and said thermoelectric conversion part has a plurality of thermoelectric conversion parts which convert the heat generated by said plurality of photothermal conversion layers into the electric signals.

BRIEF DESCRIPTION OF THE DRAWINGS

FIGS. 3A and 3B are top face views extracting a thermoelectric conversion part and a photothermal conversion layer which are substantial parts of FIG. 2.

FIG. 4 is a top surface view showing a layout of a thermal type infrared ray imaging device of the present embodiment.

FIG. 5 is a conceptual view for explaining operation of the thermal type infrared ray imaging device of the present embodiment.

DESCRIPTION OF THE PREFERRED EMBODIMENTS

Hereinafter, one embodiment of a thermal type infrared ray imaging device according to the present invention will be described with reference to drawings.

The thermal type infrared ray imaging device of one embodiment described hereinafter detects infrared ray of multiple wavelengths, and has a structure in which a plurality of pixels for detecting infrared rays are arranged in matrix shape.

Figure 1:
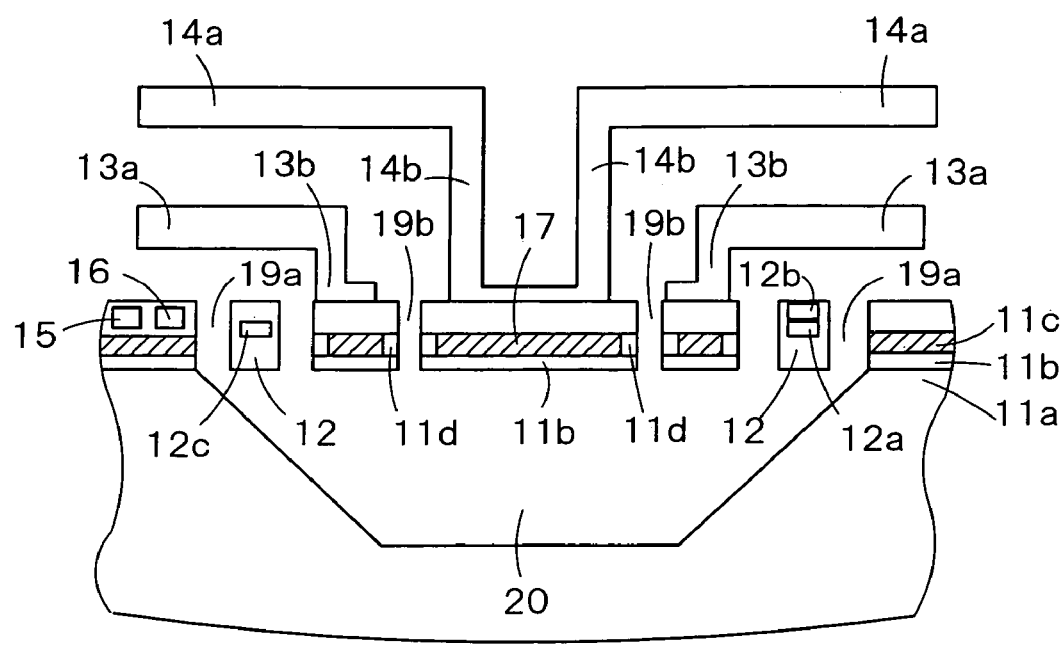
FIG. 1 is a cross section view showing a structure for one pixel of the thermal type infrared ray element of one embodiment according to the present invention.
Figure 2:
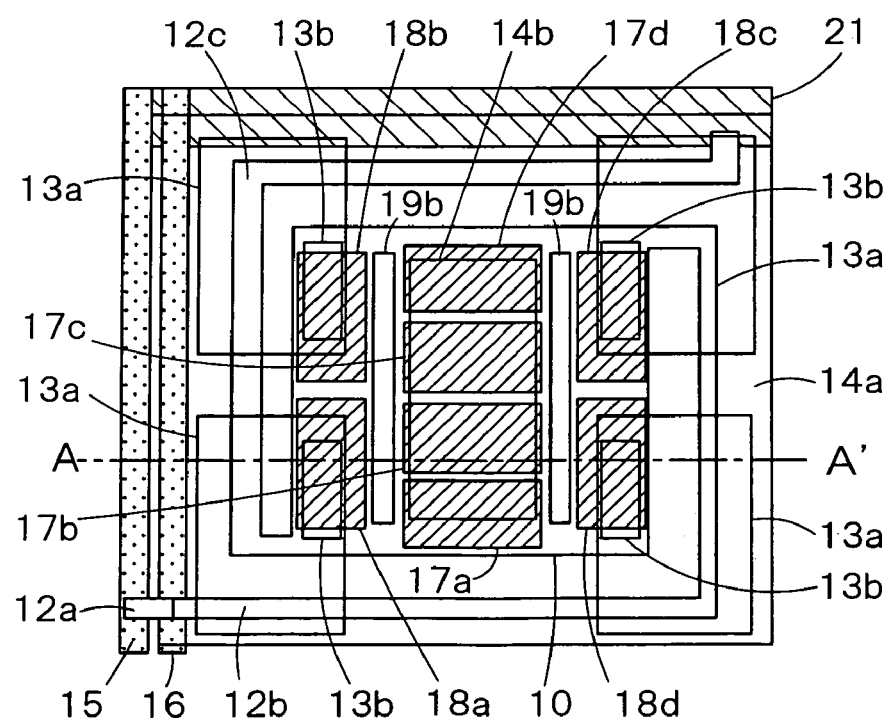
FIG. 2 is a top face view of the thermal type infrared ray imaging device of the present embodiment.

FIG. 1 is a cross section view showing a structure for one pixel of the thermal type infrared ray element of one embodiment according to the present invention. FIG. 2 is a top surface view of the thermal type infrared ray imaging device of the present embodiment, and FIGS. 3A and 3B are top surface views extracting a thermoelectric conversion part and an photothermal conversion layer which are substantial parts of FIG. 2.

As shown in FIG. 1, a thermoelectric conversion part 17 (a second thermoelectric conversion part and a thermoelectric conversion part for second waveband) of the infrared ray detection pixels and a thermoelectric conversion part 18 (a first thermoelectric conversion part and a thermoelectric conversion part for first waveband) of the infrared detection pixels are provided at the state of floating on a hollow area 20 formed inside the single crystal silicon substrate 11a, and are supported on the single crystal silicon substrate 11a by a support leg 12. Here, the hollow area 20 is formed by selectively removing by etching, for example, a portion of the single crystal silicon substrate 11a of the SOI (Silicon On Insulator) substrate containing the single crystal silicon substrate 11a, the embedded oxide film 11b and the single crystal silicon layer 11c. Reference number 19a is a groove portion formed between the support leg 12 and the single crystal silicon substrate 11a, and reference number 19b is a groove portion formed between the thermoelectric conversion parts 17 and 18. It is possible to effectively perform temperature variation of the thermoelectric conversion part by the incident infrared ray, by providing the thermoelectric conversion parts 17 and 18 and the support leg 12 on the hollow structure 20. Although reference number 11b is the buried oxide film on the SOI substrate as mentioned above, this film is also provided below under surface of the thermoelectric converters 17 and 18.

In FIG. 1, the thermoelectric conversion parts 17 and 18 look to be formed by being physically segmentalized. However, as shown in top surface view of FIG. 2, the thermoelectric conversion parts 17 and 18 are in reality formed on an all-in-one device region 10. That is, the device region 10 is supported on the single crystal silicon substrate 11a by the support leg 12, and grooves 19b with two stripes are formed on portions of the device region 10 in parallel to each other. The thermoelectric conversion part 17 is provided between the grooves 19b with two stripes, and the thermoelectric conversion part 18 is provided at outer area of the grooves 19b. Reference number 11d is a device isolation insulation film provided between the thermoelectric conversion parts 17 and 18, and the device isolation insulation film 11d is made of, for example, silicon dioxide.

As shown in FIG. 3A, the thermoelectric conversion part 17 has thermoelectric conversion elements 17a, 17b, 17c and 17d. The thermoelectric conversion elements 17a, 17b, 17c and 17d are connected in series by using connection wirings.

The thermoelectric conversion elements 17a, 17b, 17c and 17d are consisted of diodes such as pn junction, respectively. The diodes are made of the single crystal silicon layer of the SOI substrate. A p layer and an n layer located at both ends of pn junction of the diode may be arranged in a direction parallel to the substrate surface, or may be laminated in a direction vertical to the substrate surface.

As shown in FIG. 3B, the thermoelectric conversion part 18 has the thermoelectric conversion elements 18a, 18b, 18c and 18d, and the thermoelectric conversion elements 18a and 18b are disposed at one side of two grooves 19b, and the thermoelectric conversion elements 18c and 18d are disposed at the other side of two grooves 19b.

These thermoelectric conversion elements 18a, 18b, 18c and 18d are connected in series, similarly to the thermoelectric conversion part 17. For example, these thermoelectric conversion elements 18a, 18b, 18c and 18d are consisted of diodes having pn junction formed in the silicon layer.

As shown in FIG. 3A, the photothermal conversion layer 14a is supported by the support pillar 14b on the thermoelectric conversion elements 17a, 17b, 17c and 17d of the thermoelectric conversion part 17 (a second thermoelectric conversion part and a thermoelectric part for second waveband), and is provided spreading in a horizontal direction of the substrate. As shown in FIG. 3B, four photothermal conversion layers 13a are supported by the support pillar 13b on the thermal electric conversion elements 18a, 18b, 18c and 18d, and are provided in the horizontal direction of the substrate.

As shown in FIG. 1, the photothermal conversion layer 13a is disposed below the photothermal conversion layer 14a. As the photothermal conversion layer 13a, for example, BPSG (Bolon Phosphorus doped in Silicate Glass) or BSG (Bolon doped in Silicate Glass), PSG (Phosphorus doped in Silicate Glass) and so on are used. As the photothermal conversion layer 14a, for example, a lamination film formed by laminating silicon nitride film on silicon dioxide), FSG (Fluorosis doped in Silicate Glass) and so on are used.

Hereinafter, the support leg 12 will be explained in detail. The support leg 12 has wirings 12a, 12b and 12c are formed inside a support beam formed of an insulation film such as silicon dioxide or silicon nitride. The support leg 12 is disposed to surround the device region 10 between the single crystal silicon substrate 11a and the device region 10 in which the thermoelectric conversion parts 17 and 18 are formed in order to support the device region.

Heat conductance of the support leg 12 is not more than about $2 \times 10^{-7}$ W/K, and the support leg 12 thermally separates the device region 10 from the single crystal silicon substrate 11a. The number of the support legs 12 may not be two pieces. The number of the support legs may be more than two or less than two, if necessary. The wirings 12a and 12b are output wirings for a first waveband and a second waveband, as described below in detail. The wiring 12c is a common input wiring for first waveband and the second waveband.

The thermoelectric conversion part 18 has the thermoelectric conversion elements 18a, 18b, 18c and 18d connected in series in order. One end of the output wiring 12a is connected to the thermoelectric conversion element 18d disposed at the most outer side. The connection point of one end of the output wiring 12a is omitted in FIG. 2. The other end of the output wiring 12a is connected to a vertical signal wiring 15 for a first waveband.

The thermoelectric conversion part 17 has thermoelectric conversion elements 17a, 17b, 17c and 17d connected in series in order. One end of the output wiring 12b is connected to the thermoelectric conversion element 17d disposed at the most outer side. The other end of the output wiring 12b is connected to a vertical signal wiring for second waveband 16.

As shown in FIG. 2, the vertical signal wiring for first waveband 15 and the vertical signal wiring for second waveband 16 are provided in parallel to each other, and these wirings 15 and 16 are commonly connected to a plurality of pixels disposed in column direction. On the other hand, one end of the input wiring 12c is connected to the thermoelectric conversion element 18a of the thermoelectric conversion part 18 disposed at the nearest location to input side (horizontal signal line side) and the thermoelectric conversion element 17a of the thermoelectric conversion part 17 disposed at the nearest location to input side (horizontal signal line side). The other end of the input wiring 12c is connected to a common horizontal signal line wiring (horizontal address line) 21 for the first and second wavebands. The horizontal signal wiring (horizontal address line) 21 is commonly connected to pixels disposed in row directions.

FIG. 4 is a top surface view showing a layout of a thermal type infrared ray imaging device of the present embodiment. In FIG. 4, reference number 51 is an image area within which detection pixels of the above-mentioned infrared ray imaging devices are disposed in matrix shape. Reference number 52 is a vertical shift register circuit to which the horizontal address line 21 is connected. Reference number 53 is a horizontal shift register circuit to which the vertical signal wiring for first waveband 15 and the vertical signal wiring for second waveband 16 are connected, reference number 55 is a signal processing circuit for first waveband, reference number 56 is a signal processing circuit for second waveband, reference number 57 is a signal output circuit for first waveband, reference number 58 is a signal output circuit for second waveband, reference number 59 is a signal output pad for first waveband, reference number 60 is a signal output pad for second waveband, reference number 54 is a bonding pad for supplying drive pulses of the other shift register or an amplification circuit.

Next, operation of the thermal type infrared ray imaging device of the present embodiment will be explained. FIG. 5 is a conceptual view for explaining operation of the thermal type infrared ray imaging device of the present embodiment. As shown in FIG. 5, reference number 32 is an infrared ray incident from outside. The infrared ray is concentrated by a lens 31 and incident to the image area 51 of the above-mentioned thermal type infrared ray imaging device.

The infrared ray of second waveband (for example, waveband 8–12 μm) among the incident infrared ray is absorbed in the photothermal conversion layer 14a in order to perform heat conversion. The generated heat is transmitted to the thermoelectric conversion part 17 via the support pillar 14b, and is converted into the electric signal by the thermoelectric conversion part 17. The electric signal generated by this conversion is transmitted to the vertical signal wiring for second waveband 16 via the output wiring 12b. And then via the horizontal shift register circuit 53 of FIG. 4, the electric signal is subjected to signal processings by the signal processing circuit 56 for second waveband, and then is outputted from the signal output pad for second waveband 60.

The infrared ray of first waveband (for example, waveband is 3–5 μm) not absorbed by the photothermal conversion layer 14a is absorbed by the photothermal conversion layer 13a in order to perform heat conversion. The generated heat is transmitted to the thermoelectric conversion part 18 via the support pillar 13b in order to perform conversion to electric signal. The electric signal generated by this conversion is transmitted to the vertical signal wiring for first waveband 15 via the output wiring 12a, and is subjected to signal processings by the signal processing circuit for first waveband 55 via the horizontal shift register circuit 53 of FIG. 4. And then the electric signal is outputted from the signal output pad for first waveband 59 via the signal output circuit for first waveband 57.

Thus, according to the present embodiment, it is possible to separately detect and output the infrared ray of the first waveband and the infrared ray of the second waveband. Because of this, it is possible to estimate emissivity of the object under test by obtaining intensity of a plurality of infrared rays radiated from the object. Accordingly, it is possible to easily identify materials of the object and to precisely measure absolute temperature, thereby improving contrast of image of the infrared ray and colorizing the image.

Especially, according to the present embodiment, when the infrared ray of first waveband and the infrared ray of second waveband are separately detected, the photothermal conversion layer corresponding to the infrared rays of a plurality of wavebands as shown in above-mentioned embodiment is doubly disposed in the direction vertical to the substrate surface, and further a plurality of thermoelectric conversion parts for converting the heat generated by the photothermal conversion layers into heat are disposed to be integrated to one pixel. Because of this, it is possible to prevent increase of non-sensitive area for the infrared rays within wavebands, and to sensitively take a picture of a faraway small object.

Furthermore, the grooves 19b of two stripes are provided between the thermoelectric conversion parts 17 and 18. Therefore, thermal isolation between both of the thermoelectric conversion parts 17 and 18 is ensured. It is possible to improve accuracy of heat sensitivity in the thermoelectric conversion part, thereby obtaining more excellent infrared ray image.

As compared with the case where pixels having different sensitive wavelengths are alternatively arranged for every column known as the conventional technique, even if the imaging size and the number of pixels are the same, the image area becomes small. Therefore, it is possible to downsize optical mechanism and to realize multi-wavelength infrared ray image sensor at low price. Furthermore, when the image area size is the same, it is possible to enlarge the imaging size, and to realize high-sensitive and multi-wavelength infrared ray image sensor.

In the above-mentioned embodiment, the photothermal conversion layer 14a of the upper layer converts into heat the infrared ray within waveband longer than that of the photothermal conversion layer 13a of the lower layer. Thus, because the photothermal conversion layer 14a capable of absorbing the infrared ray within longer waveband to the upper layer portion through which the infrared ray passes on ahead is disposed, it is possible to effectively absorb the infrared ray within a long waveband which is more reflective in the upper layer, and to restrict deterioration of absorption efficiency such as reflection. Furthermore, the photothermal conversion layer 13a for absorbing the infrared ray within short waveband is provided to the lower layer portion. It is possible to effectively absorb in total the infrared rays within multiple-waveband.

Furthermore, as a structure of the photothermal conversion layer, in the case where the photothermal conversion layer 14a with large area is provided to the upper layer, and the photothermal conversion layer 13a with small area is provided to the lower layer, fabrication process is easier than in the case where disposition of the upper layer and the lower layer is opposite. Even in this point, the structure of the present embodiment is desirable.

Moreover, the photothermal conversion layer 14a of large area tends to absorb the infrared ray of longer wavelength, and the photothermal conversion layer 13a of small area tends to absorb the infrared ray of shorter wavelength. Because of this, it is possible to improve absorption efficiency of the infrared ray by enlarging the area of the photothermal conversion layer 14a of the upper layer more than that of the photothermal conversion layer 13a of the lower layer. Thus, the present embodiment excels in absorption efficiency of the infrared ray and fabrication process.

Especially, it is desirable that the size of acceptance surface of the photothermal conversion layer 14a of the upper layer is not less than at least 10 μm per side, and the size of the acceptance surface of the photothermal conversion layer 13a of the lower layer is not less than at least 3 μm and is less than 8 μm.

Next, fabrication method of the thermal type infrared ray imaging device of FIG. 1 will be explained. FIGS. 6–23 are cross section views of fabrication steps for explaining fabrication methods of the thermal type infrared ray imaging device of FIG. 1. Each view shows a cross section view cut off by A–A'.

Figure 6:
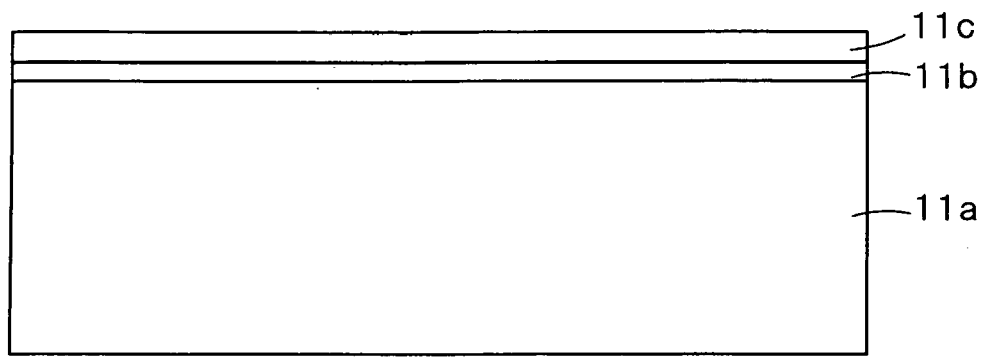
FIG. 6 is a cross section view showing fabrication step of the thermal type infrared ray imaging device of the first embodiment of the present invention.

First of all, as shown in FIG. 6, an SOI substrate which is formed by laminating an buried silicon dioxide film 11b and a single crystal silicon layer 1c on a single crystal silicon support substrate 11a is prepared as a semiconductor substrate.

Figure 7:
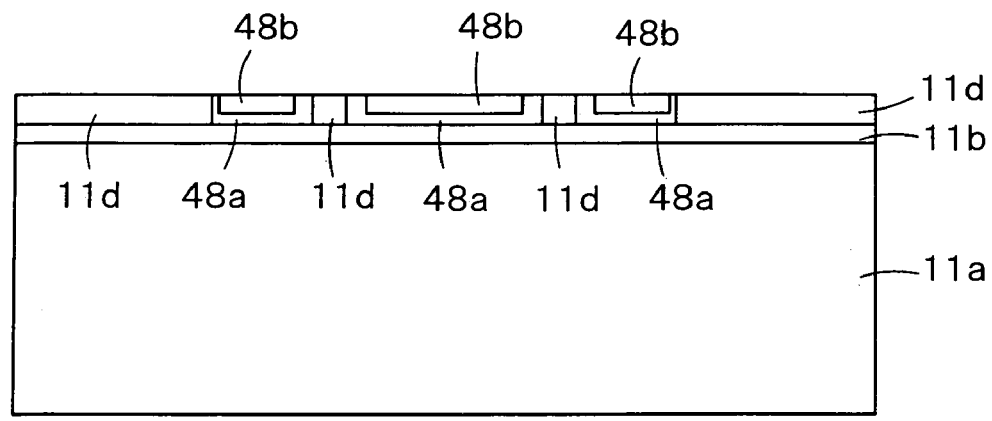
FIG. 7 is a cross section view following to FIG. 6.

Next, an STI (Shallow-Trench-Isolation) fabrication is performed, similarly to device isolation in general LSI fabrication steps. More specifically, as shown in FIG. 7, the device isolation area is prescribed by using photolithography. The single crystal silicon layer 11c of the device isolation area is removed by etching by using a technique such as RIE (Reactive-Ion-Etching). After then, the device isolation silicon dioxide film 11d is embedded by using a technique such as CVD (Chemical-Vapor-Deposition), and then is evened by using a technique such as CMP (Chemical-Mechanical-Polishing). At this time, the area of the support pillar is also defined as the device isolation area, and the device isolation silicon dioxide film 11d is embedded.

Next, a diode having pn junction is formed of the single crystal silicon layer 11c. After forming the diode, the device isolation silicon dioxide film 11d may be formed.

It is possible to use a technique such as injection of impurity ion, heat treatment activation and diffusion in order to form the diode. For example, when $n^+$ type silicon layer is formed on surface of p type silicon layer, impurity ion As may be injected by, for example, acceleration voltage 50 kV and the dose amount $5 \times 10^{15}$ $cm^{-2}$.

FIGS. 7–23 show an example in which n type (p type) conduction type semiconductor layer 48b is selectively formed on a surface of a p type (n type) conduction type semiconductor layer 48a, as a diode.

The diode consisted of the p type conduction type semiconductor layer 48a and the n type conduction type semiconductor layer 48b of FIGS. 7–23 corresponds to diodes 17a, 17b, 17c and 17d of FIG. 3A constituting the thermoelectric conversion part 17 and diodes 18a, 18b, 18c and 18d of FIG. 3B constituting the thermoelectric conversion part 18.

Figure 8:
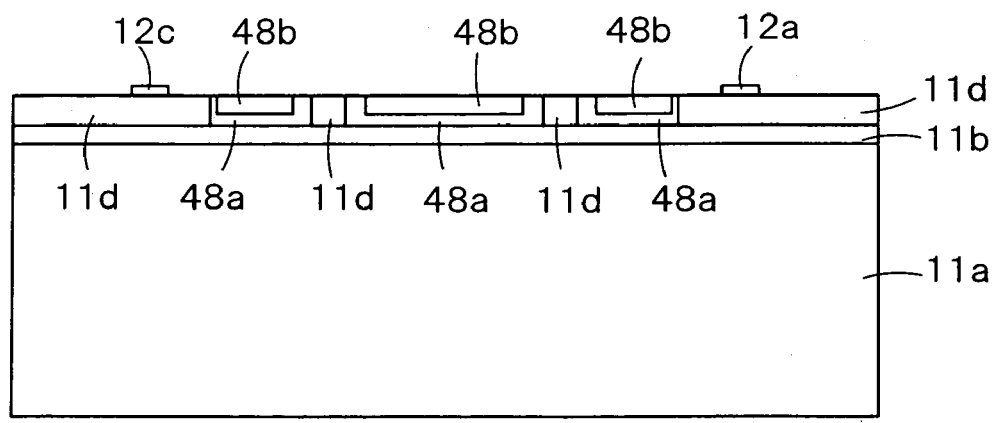
FIG. 8 is a cross section view following to FIG. 7.

Next, as shown in FIG. 8, after a metal layer such as aluminum is formed on the substrate, the metal layer is patterned by RIE and so on in order to form an input wiring 12c and an output wiring 12a. The output wiring 12a is an output wiring for first waveband as explained in the first embodiment, and is connected to the diode shown in FIG. 3B at cross section location different from the cross section of FIG. 8. The input wiring 12c is a common input wiring for first and second wavebands, and connected to the diode 18a shown in FIG. 3B and the diode 17a shown in FIG. 3A at cross section location different from the cross section of FIG. 8.

Figure 9:
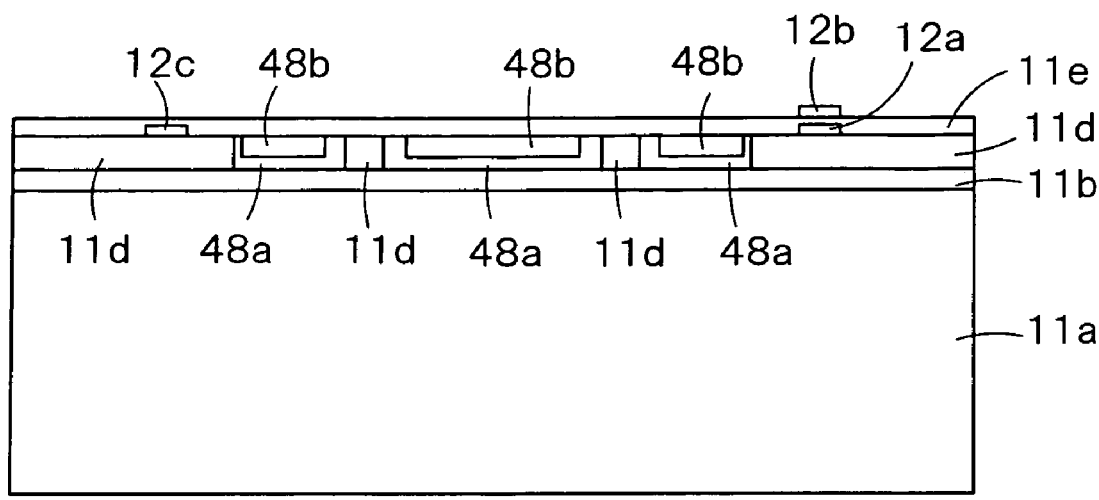
FIG. 9 is a cross section view following to FIG. 8.

Next, as shown in FIG. 9, after an interlayer insulation film 11e such as silicon dioxide is formed on the substrate, an output wiring 12b is formed by using the metal film. The output wiring 12b is connected to the diode 17d at cross section location different from the cross section of FIG. 9 via a contact hole not shown.

Figure 10:
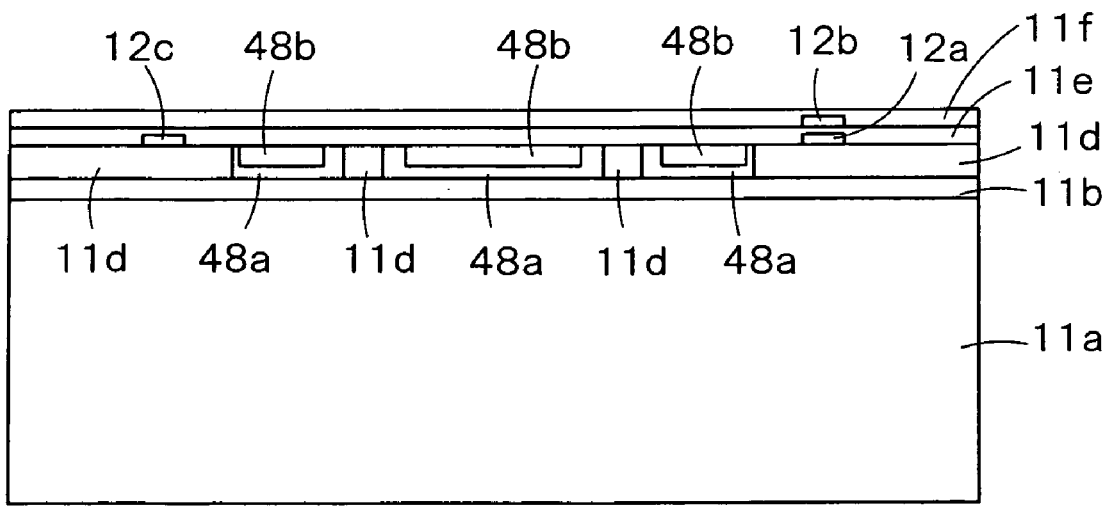
FIG. 10 is a cross section view following to FIG. 9.

Next, as shown in FIG. 10, an interlayer insulation film 11f such as silicon dioxide is formed on the substrate including a top surface of the output wiring 12b.

Figure 11:
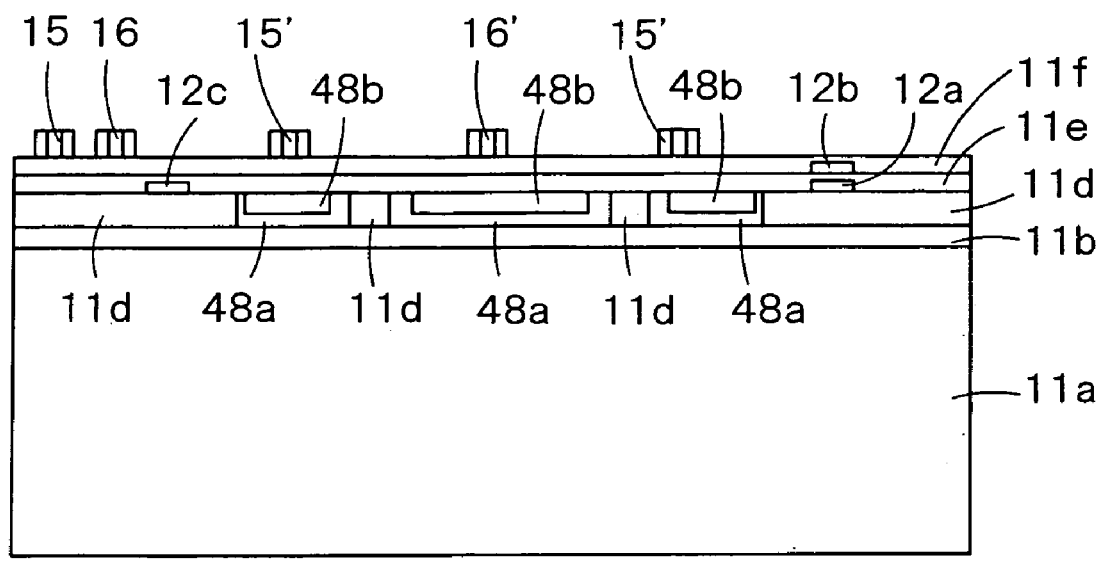
FIG. 11 is a cross section view following to FIG. 10.

Next, as shown in FIG. 11, connection wirings 15' and 16', the vertical signal wiring for first waveband 15 and the vertical signal wiring for second waveband 16 are formed on the upper surface of the interlayer insulation film 11f. The connection wiring 15' is a wiring for directly connecting diodes 18a, 18b, 18c and 18d. The connection wiring 16' is a wiring for directly connecting diodes 17a, 17b, 17c and 17d. The connection wirings 15' and 16' are connected to the diodes via contact holes not shown.

Figure 12:
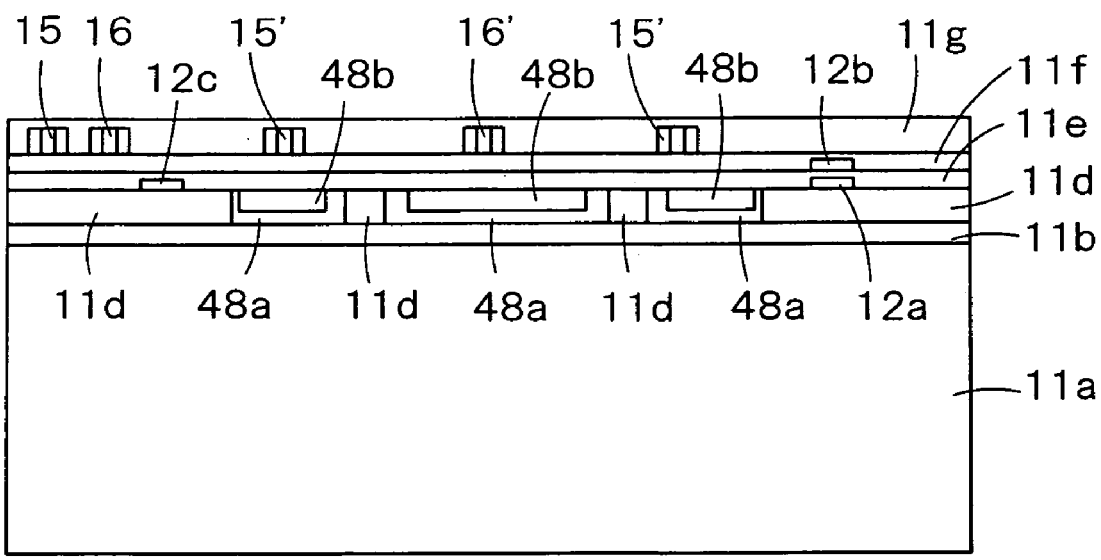
FIG. 12 is a cross section view following to FIG. 11.
Figure 13:
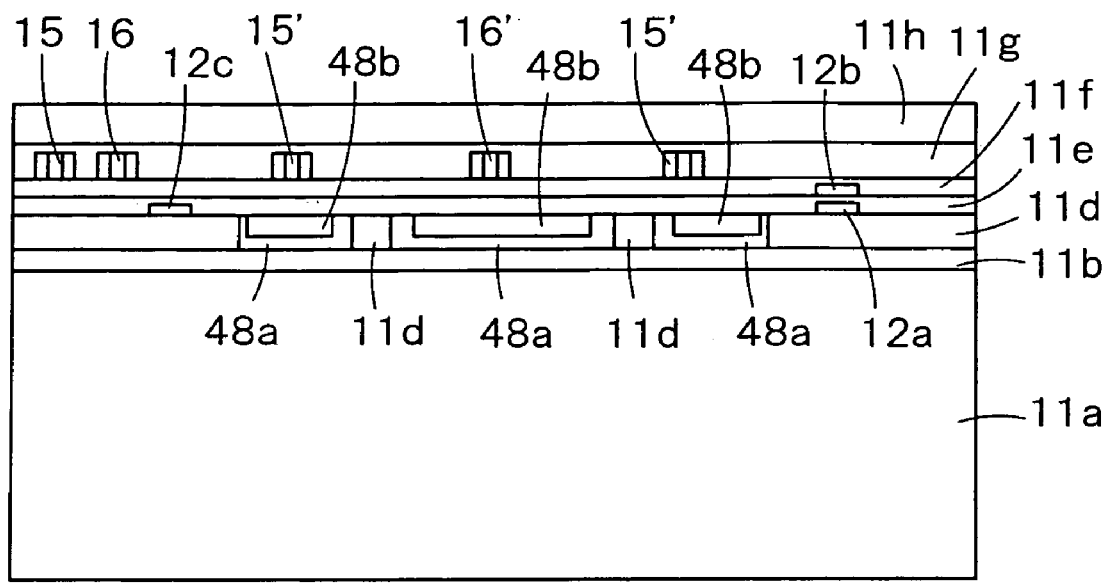
FIG. 13 is a cross section view following to FIG. 12.

Next, as shown in FIG. 12, an interlayer insulation film 11g such as silicon dioxide is formed on the substrate so as to cover the connection wirings 15' and 16', the vertical signal wiring for first waveband 15 and the vertical signal wiring for second waveband 16. Subsequently, as shown in FIG. 13, an interlayer insulation film 11h such as silicon dioxide is formed on the substrate.

Figure 14:
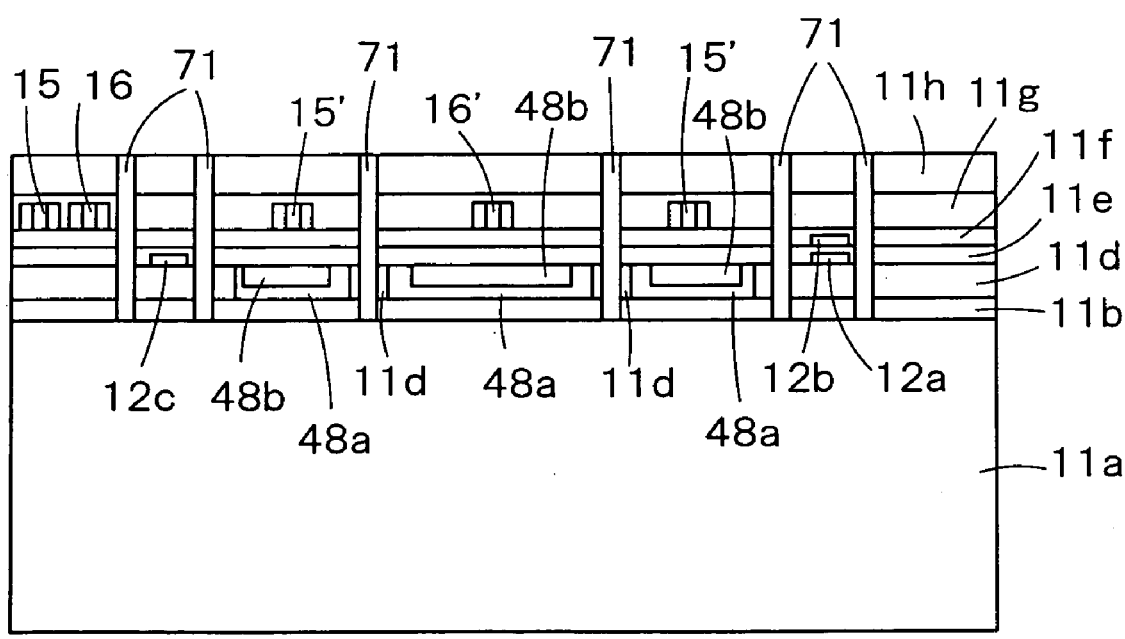
FIG. 14 is a cross section view following to FIG. 13.

Next, as shown in FIG. 14, an etching hole 71 is formed from the interlayer insulation film 11h through the buried silicon dioxide film 11b by RIE by using etching mask not shown. The etching hole 71 is formed at surrounding area of the input wiring 12c and is also formed in the area between the thermoelectric conversion parts 17 and 18.

Figure 15:
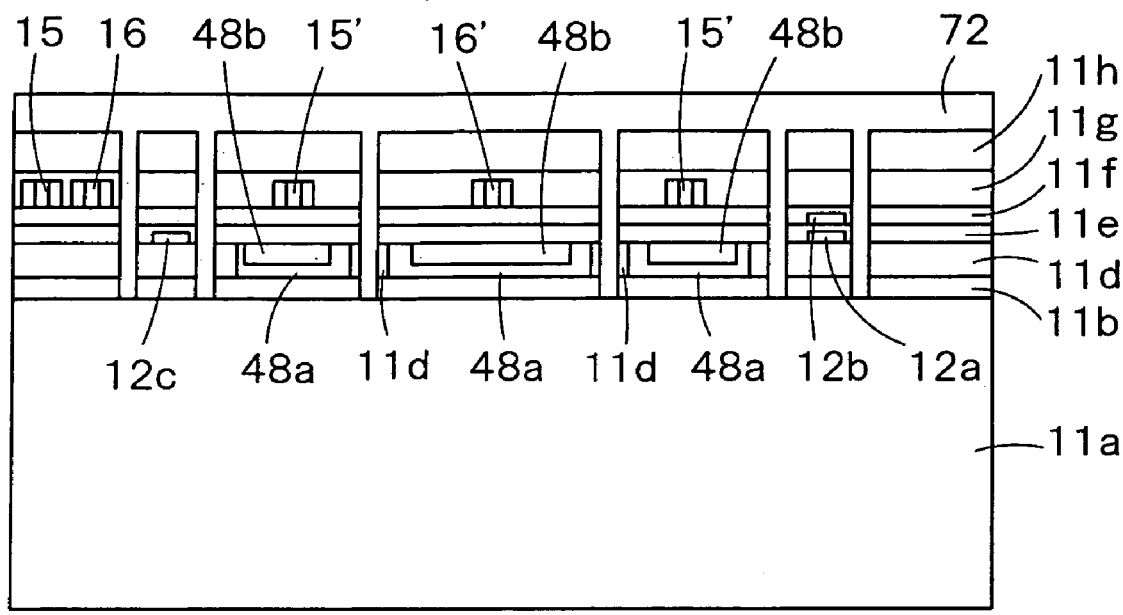
FIG. 15 is a cross section view following to FIG. 14.

After then, as shown in FIG. 15, a sacrifice layer 72 is formed on the substrate by using CVD method. Material of the sacrifice layer 72 is amorphous silicon or polyimide. At this time, the sacrifice layer 72 is embedded in the etching hole 71 shown in FIG. 14.

Figure 16:
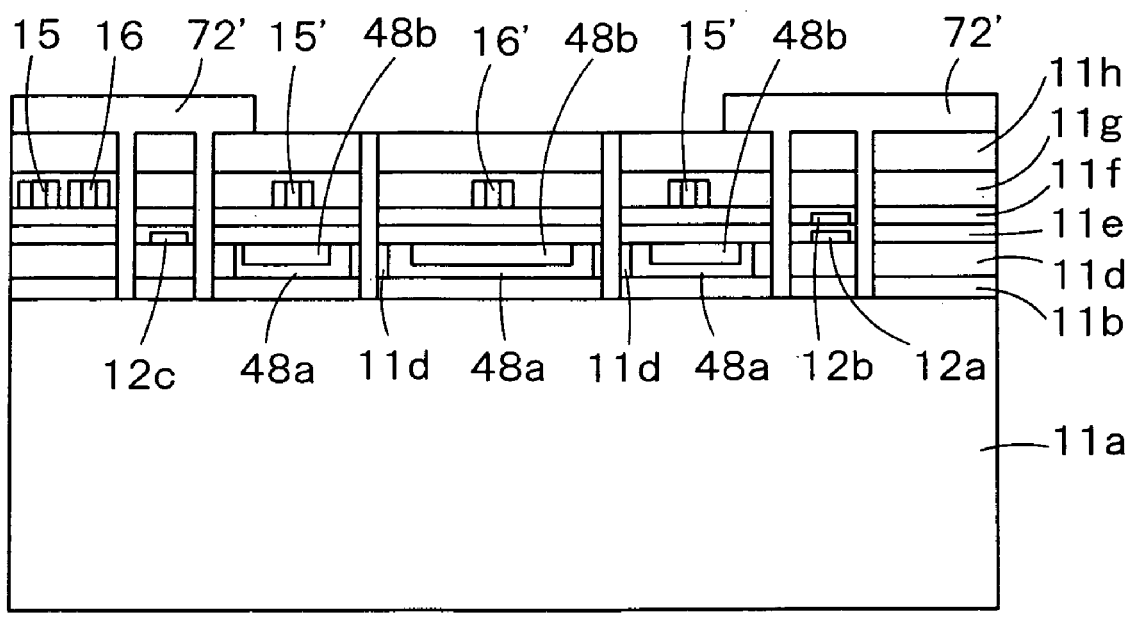
FIG. 16 is a cross section view following to FIG. 15.

Next, as shown in FIG. 16, a mask not shown is provided on the sacrifice layer 72. A portion of the sacrifice layer 72 is removed by etching by performing RIE using the mask. As a result, the sacrifice pattern 72' is remained in a peripheral area of pixels (including areas on the output wirings 12a and 12b and the input wiring 12c, and within the surrounding etching hole 71), and is remained in the etching hole 71 between the thermoelectric conversion part 17 and the thermoelectric conversion part 18.

Figure 17:
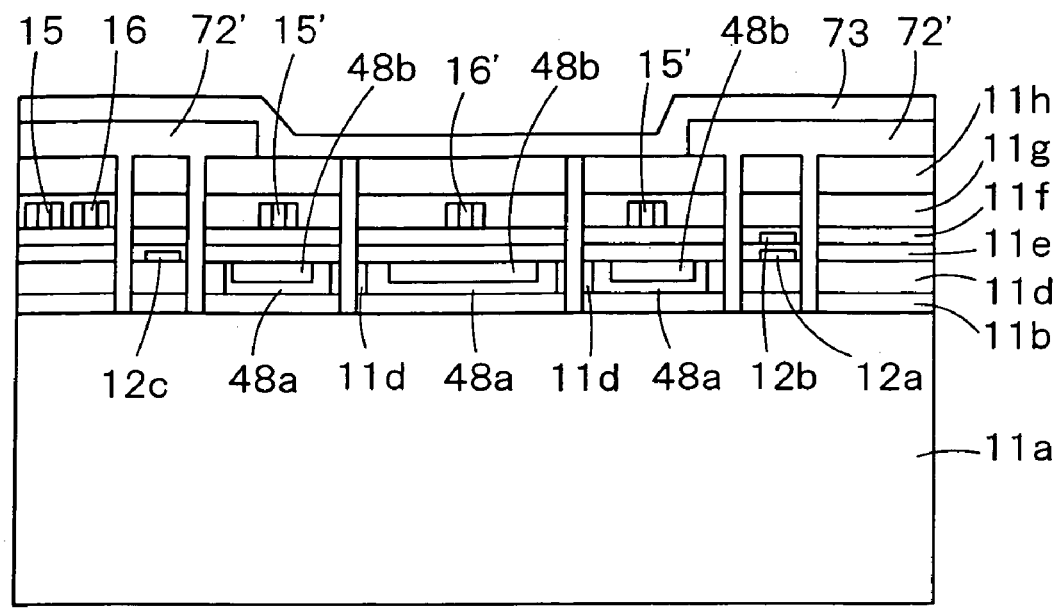
FIG. 17 is a cross section view following to FIG. 16.
Figure 18:
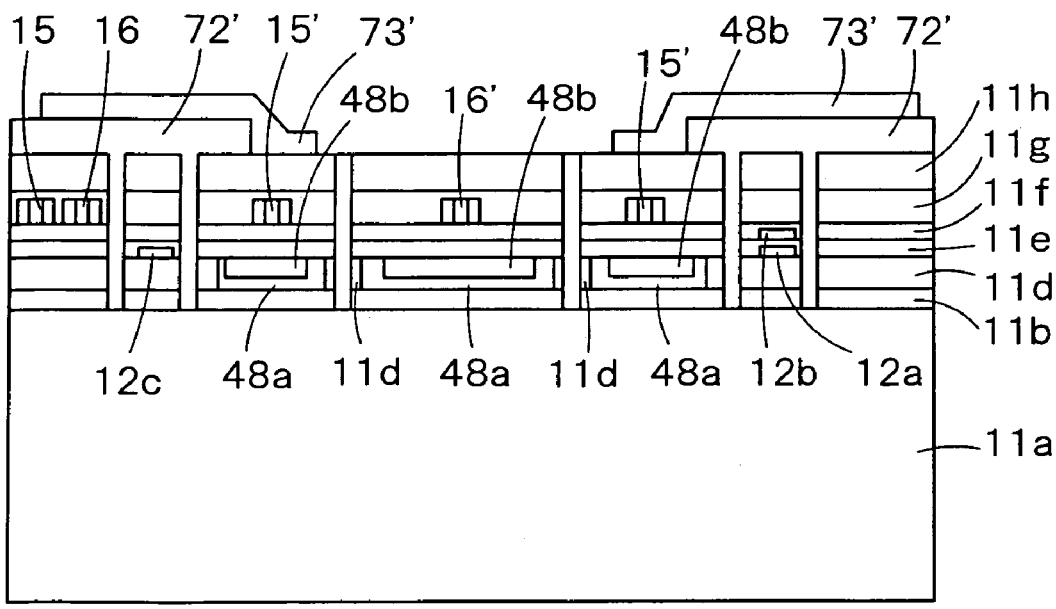
FIG. 18 is a cross section view following to FIG. 17.

Next, as shown in FIG. 17, for example, BPSG (Bolon-Phosphorus doped Silicate Glass) film 73 is formed on the substrate. Subsequently, as shown in FIG. 18, the BPSG film 73 is etched by using the mask. The BPSG pattern 73' obtained as this result corresponds to the photothermal conversion layer 13a and the support pillar 13b of FIG. 1. In the present embodiment, the size of the BPSG pattern 73' is 5 μm per side and the thickness thereof is about 0.4 μm.

Figure 19:
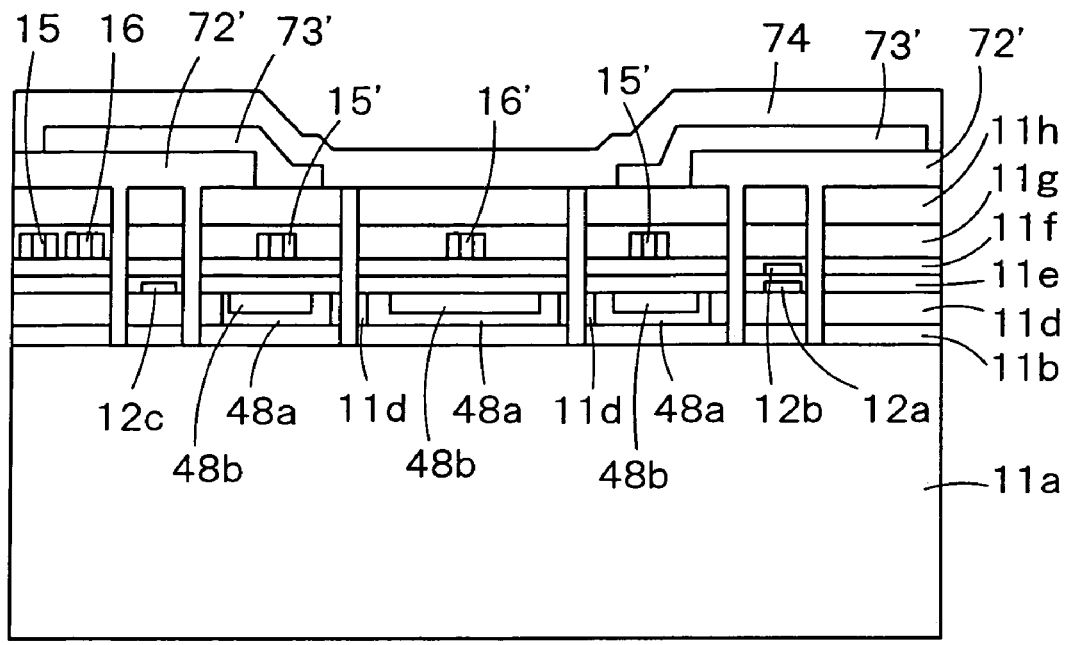
FIG. 19 is a cross section view following to FIG. 18.
Figure 20:
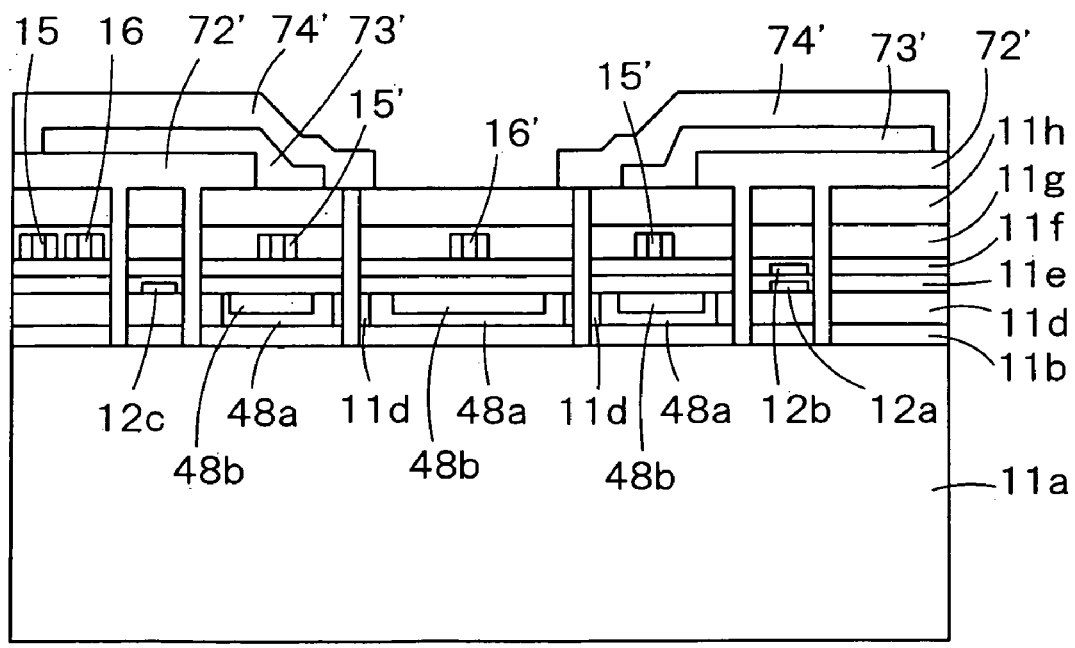
FIG. 20 is a cross section view following to FIG. 19.

Next, as shown in FIG. 19, the sacrifice layer 74 is formed on the substrate by CVD method. Material of the sacrifice layer 74 is amorphous silicon or polyimide. Furthermore, as shown in FIG. 20, a mask not shown is provided on the sacrifice layer 74. A portion of the sacrifice layer 74 is removed by etching by performing RIE using the mask. As a result, the sacrifice layer pattern 74' remains in an area covering the BPSG pattern 73' (including an areas on the output wiring 12a and the input wiring 12c, and an area on the etching hole between the thermoelectric conversion parts 17 and 18).

Figure 21:
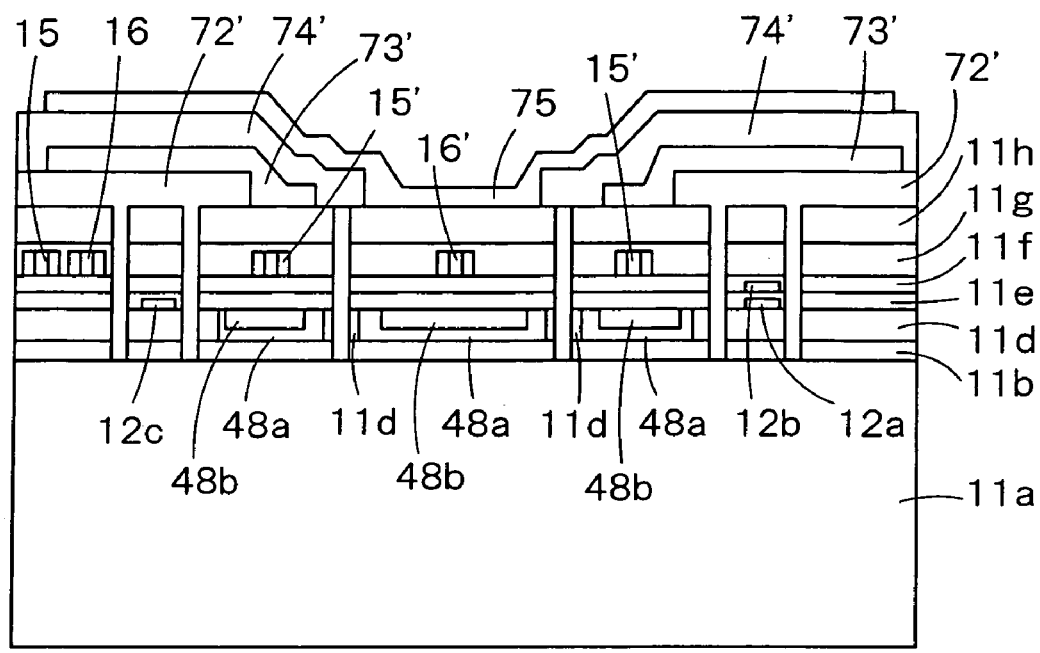
FIG. 21 is a cross section view following to FIG. 20.

Next, as shown in FIG. 21, the laminate film 75 obtained by laminating the silicon dioxide film and the silicon nitride film is formed on the substrate. Furthermore, the laminate film 75 is etched by using the mask not shown. Therefore, the laminate film pattern 75 is formed as the photothermal conversion layer 14a and the support pillar 14b of FIG. 1.

According to the present embodiment, the size of the laminate film pattern is 10 μm per side, and the thickness of the silicon dioxide film is about 0.4 μm, and the thickness of the silicon nitride film is about 0.2 μm. The laminate film pattern 75 is selectively removed by etching so as to be able to remove the material of the sacrifice layer by etching.

Figure 22:
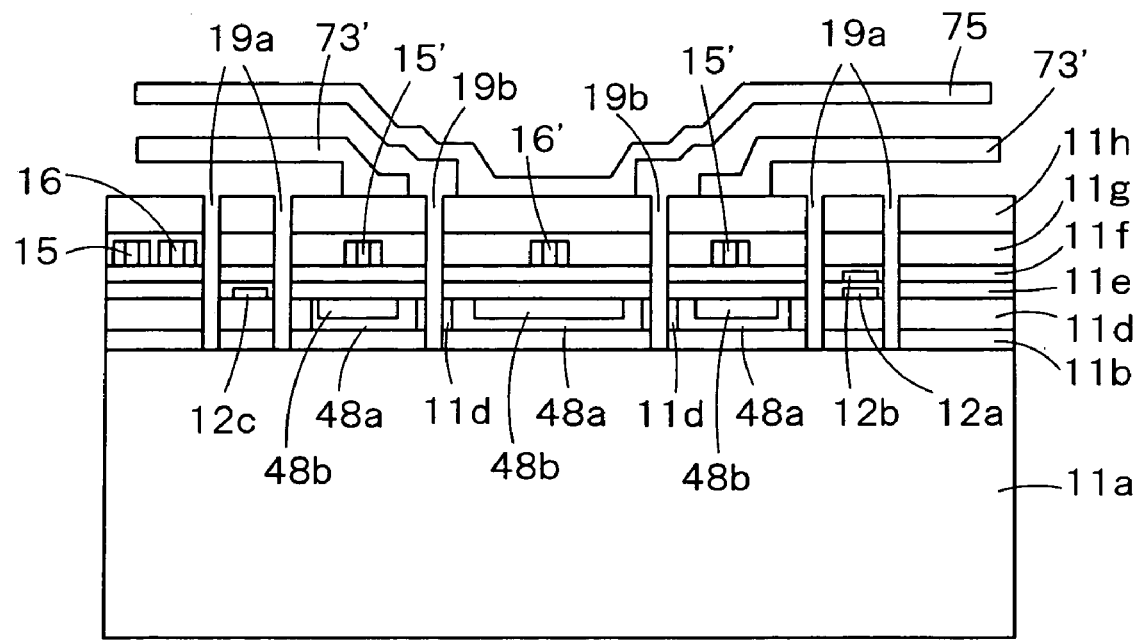
FIG. 22 is a cross section view following to FIG. 21.

Next, as shown in FIG. 22, in order to selectively remove the sacrifice layer pattern 72', 74' and the material of the sacrifice layer embedded in the etching hole 71, the material of the sacrifice layer is etched by using alkalis etching liquid solution such as KOH or TMAH (Tetra-Methyl-Ammonium-Hydroxide). In this step, the interlayer insulation films 11e–11h, the embedded silicon dioxide film 11b, the BPSG patter 73' and the laminate film pattern 75 are not etched. As a result, the single crystal silicon support substrate 11a of the bottom surface of the etching hole formed in FIG. 18 is exposed in order to form a void portion 19a and the grooves 19b, a void between the BPSG pattern 73' corresponding to the photothermal conversion layer 13a and the support pillar 13b, and the laminate film 75 corresponding to the photothermal conversion layer 14a and the support pillar 14b is formed, and a void is formed below the BPSG pattern 73' corresponding to the photothermal conversion layer 13a.

Figure 23:
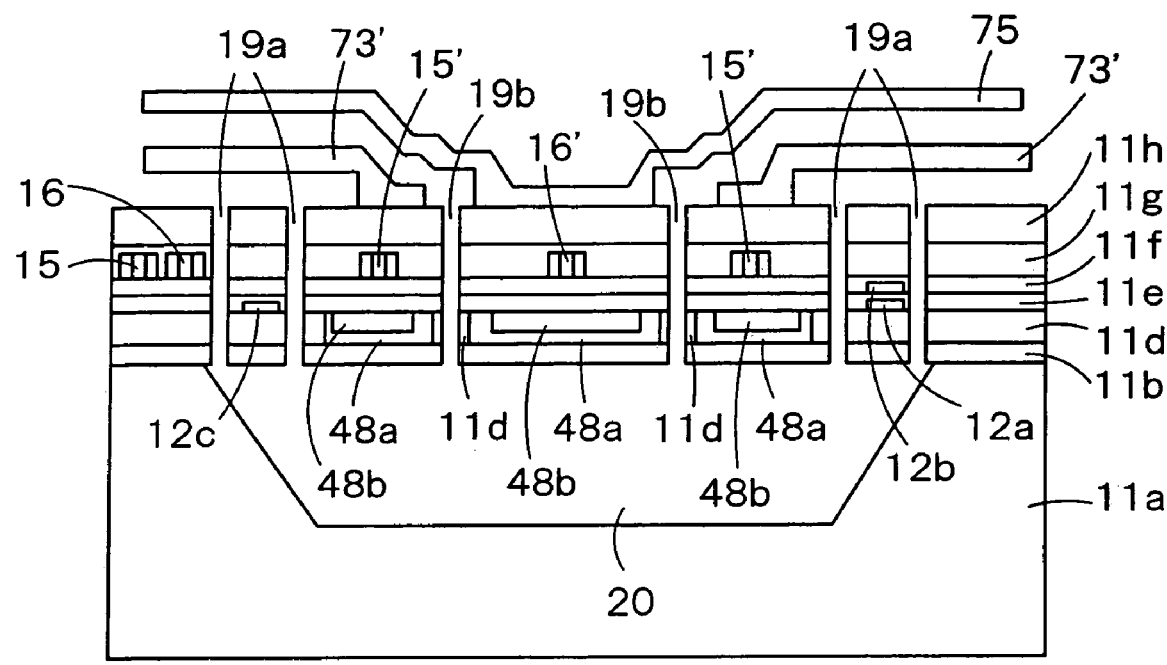
FIG. 23 is a cross section view following to FIG. 22.
Figure 24:
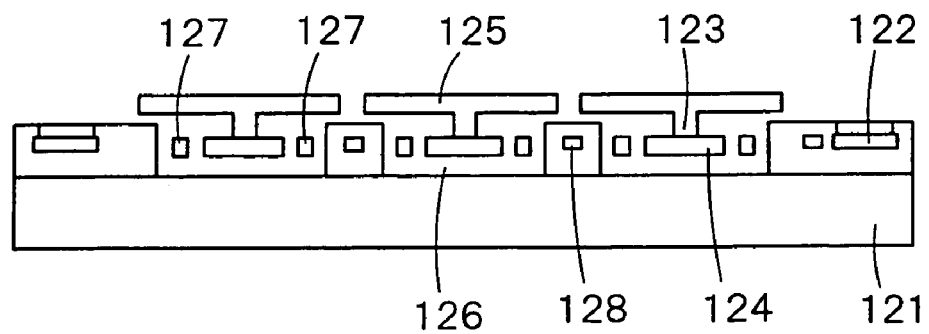
FIG. 24 is a cross section view showing configuration of one pixel of a conventional thermal type infrared ray imaging device.

After then, as shown in FIG. 23, the etching liquid such as TMAH is supplied to the single crystal silicon support substrate 11a via the etching hole 71, and the single crystal silicon support substrate 11a is subjected to anisotropic etching. A hollow portion is generated on the single crystal support substrate 11a under the pixels of the thermal type infrared ray imaging device in order to form the hollow structure 20.

By the above-mentioned steps, it is possible to form the thermal type infrared ray imaging device of the first embodiment for one pixel shown in FIG. 1. In the present embodiment, the thermal type infrared ray imaging device has 320×240 pixels, each pixel arranging in two dimension array shape, and being formed on the same procedure as the above-mentioned procedure.

Although the image area 51 of FIG. 5 can be formed by the above-mentioned steps, area except for the image area 51 can be formed by the ordinary semiconductor process. In a sequence of etching steps of FIGS. 22 and 23, a protection layer is provided in order to prevent etching for these areas so that the area except for the image area 51 is not etched. As the protection layer, it is possible to use a silicon dioxide film formed by CVD as the protection layer.

Thus, according to the present embodiment, the infrared ray of first waveband and the infrared ray of second waveband are separately detected. Because the infrared rays can be separately outputted, it is possible to precisely measure the intensity of a plurality of infrared rays radiate from the objects and to estimate emissivity of the object under test. Therefore, it is possible to easily identify the material of the object and to precisely measure the absolute temperature. Accordingly, it is possible to improve contrast of image by the infrared ray and to realize colorization of image.

Especially, according to the present embodiment, in order to separately detect the infrared rays of first and second wavebands, the photothermal conversion layers corresponding to the infrared rays of a plurality of wavebands are doubly disposed in the direction vertical to the substrate surface, and a plurality of thermoelectric conversion parts for converting heat generated by the photothermal conversion layers into electric signal are disposed by integrating in one pixel. Therefore, it is possible to prevent increase of the non-sensitive areas for the infrared rays of the respective wavebands, and to sensitively take a picture of a faraway small object.

Furthermore, it is possible to improve heat sensitive accuracy in the thermoelectric part by ensuring heat isolation between both the thermoelectric conversion parts, thereby obtaining more excellent infrared ray image.

The present invention is not limited to the above-mentioned embodiment. For example, as a thermal separation structure, a structure providing the groove between a plurality of thermal electric conversion parts has been adopted. However, despite of such a structure, after a V shape groove is formed, it is possible to use the other structure such as the structure in which porous ceramics and so on is embedded in the V shape groove.

It is possible to use an element except for a diode as a thermoelectric conversion part. For example, it is possible to use the other devices such as an enhanced type MOS transistor, a depletion type MOS transistor, a combination of these MOS transistors, a bolometer of vanadium oxide or amorphous silicon, and so on.

Furthermore, according to the present embodiment, the hollow structure has been formed between the support substrate and the pixel of the thermal type infrared ray imaging device, by etching the single crystal silicon support substrate of the SOI substrate. However, besides the method and the structure using the SOI substrate, it may be possible to adopt a method and a structure of forming the insulation film such as oxide or nitride formed on the support substrate, and poly-crystal or mono-crystal silicon layer in order from bottom, and the surface of the support substrate and the insulation film are removed by etching in order to form the hollow structure.

Furthermore, although aluminum has been used as a wiring material in the above-mentioned embodiment, it is possible to use the other metal material. Especially, the output wirings 12a and 12b, the input wiring 12c, the vertical signal wiring for first waveband 15 and the vertical signal wiring for second waveband 16 are formed of polycide structure at the same fabrication step as that of forming the gate electrode of the MOS transistor of the peripheral circuit, thereby simplifying fabrication process. The present invention is applicable to a poly-metal structure (laminate structure of a polysilicon layer and a metal layer). The poly-metal structure can be formed at the same fabrication step as that of the gate electrode of the MOS transistor of the peripheral circuit. If the poly-metal structure is adopted, it is possible to reduce thermal noise due to electric resistance of the wiring portion of the support leg (the output wirings 12a and 12b and the input wiring 12c), thereby improving sensitivity. In this case, as a laminate structure of the support leg wirings (the output wirings 12a and 12b and the input wiring 12c), for example, it is possible to form the laminate film made of a titan nitride film as a barrier metal and a tungsten film for low resistance on the polysilicon layer.

Furthermore, it is possible to selectively leave the silicon nitride film on a side wall of the support leg wiring. In this case, it is possible to form the support leg wiring by using the same layer as the silicon nitride film formed on the gate sidewall of the MOS transistors of the peripheral circuit. Because of this, it is possible to drastically shorten the number of steps. Especially, it is possible to fabricate the high sensitive support structure at high yield and low cost, while getting the most out of compliance of process, by using the step of forming silicon nitride film and the step of forming the support leg wirings at the same layer as the gate electrode of the MOS transistor of the peripheral circuit.

Besides, it is possible to modify the present invention at range which does not deviate from purposes of the present invention, if necessary.

What is claimed is:

1. A thermal type infrared ray imaging device, comprising:
   a plurality of cells arranged on a substrate each having a photothermal conversion part which converts an infrared ray into heat, and a thermoelectric conversion part which is provided below said photothermal conversion part and which converts the heat generated by said photothermal conversion part into an electric signal;
   a selection part which selects some cells among said plurality of cells; and
   an output part which outputs the electric signal generated by said thermoelectric conversion part of each of the selected cells,
   wherein said photothermal conversion part includes:
   a first photothermal conversion layer; and
   a second photothermal conversion layer provided over and apart from said first photothermal conversion layer, which converts an infrared ray within a waveband different from a waveband of said first photothermal conversion layer into heat,
   wherein said thermoelectric conversion part includes:
   a first thermoelectric conversion part which converts the heat generated by said first photothermal conversion layer into the electric signal; and
   a second thermoelectric conversion part which is thermally separated from said first thermoelectric conversion part at the same height as that of said first thermoelectric conversion part, and which converts the heat generated by said second photothermal conversion layer into the electric signal.

2. The thermal type infrared ray imaging device according to claim 1, wherein said plurality of cells are supported by at least one heat isolation support pillar on the substrate.

3. The thermal type infrared ray imaging device according to claim 2, wherein said heat isolation support pillar is disposed to surround each of said plurality of cells.

4. The thermal type infrared ray imaging device according to claim 1, wherein each of said plurality of cells corresponds to one pixel and m×n pixels of said cells are arranged in a two-dimensional direction.

5. The thermal type infrared ray imaging device according to claim 1, further comprising:
   a first support pillar which supports said first photothermal conversion layer on said first thermoelectric conversion part; and
   a second support pillar which supports said second photothermal conversion layer on said second thermoelectric conversion part.

6. The thermal type infrared ray imaging device according to claim 5, wherein said first support pillar is disposed outside said second support pillar.

7. The thermal type infrared ray imaging device according to claim 1, wherein said second photothermal conversion layer has a surface which is broader than that of said first photothermal conversion layer.

8. The thermal type infrared ray imaging device according to claim 1, wherein said first and second thermoelectric conversion parts are disposed apart from each other with a groove formed therebetween.

9. The thermal type infrared ray imaging device according to claim 1, wherein said first photothermal conversion layer converts into heat the infrared ray within a waveband shorter than a waveband of said second photothermal conversion layer.

10. The thermal type infrared ray imaging device according to claim 1, wherein:
said first photothermal conversion layer is made of a silicate glass containing boron and phosphorus; and
said second photothermal conversion layer is made of a silicon dioxide.

11. The thermal type infrared ray imaging device according to claim 1, wherein said substrate is an SOI (Silicon On Insulator) substrate consisted of a single crystal silicon substrate, an embedded oxide film and a single crystal silicon layer; and
said first and second photothermal conversion parts, and said first and second thermoelectric conversion parts are formed above a hollow area obtained by removing a portion of said SOI substrate.

12. The thermal type infrared ray imaging device according to claim 11, wherein a portion of said embedded oxide film of said SOI substrate is formed below said first and second thermoelectric conversion parts.

13. The thermal type infrared ray imaging device according to claim 11, wherein said first and second thermoelectric conversion parts have diodes formed in said single crystal silicon layer of said SOI substrate.

14. The thermal type infrared ray imaging device according to claim 1, further comprising an insulation film which covers surroundings of said first and second thermoelectric conversion parts.

15. A thermal type infrared ray imaging device, comprising:
a plurality of cells arranged on a substrate each having a photothermal conversion part which converts an incident infrared ray into heat, and a thermoelectric conversion part which is provided below said photothermal conversion part and which converts the heat generated by said photothermal conversion part into an electric signal;
a selection part which selects some cells among said plurality of cells; and
an output part which outputs the electric signal generated by said thermoelectric conversion part of each of the selected cells;
wherein said photothermal conversion part has a plurality of photothermal conversion layers which convert infrared rays within different wavebands into heat, said photothermal conversion layers being disposed apart from each other in a vertical direction; and
said thermoelectric conversion part has a plurality of thermoelectric conversion parts which are thermally separated from each other at a height equal to each other, and which convert the heat generated by said plurality of photothermal conversion layers into the electric signals.

16. The thermal type infrared ray imaging device according to claim 15, wherein said plurality of photothermal conversion layers of said photothermal conversion part convert the infrared rays into heat, an upper photothermal conversion layer converting an infrared ray within a longer waveband, and a lower photothermal conversion layer converting an infrared ray within a shorter waveband.

17. The thermal type infrared ray imaging device according to claim 16, wherein said plurality of thermoelectric conversion parts are disposed apart from each other.

18. A thermal type infrared ray imaging device, comprising:
a plurality of cells arranged on a substrate each having a photothermal conversion part which converts an infrared ray into heat, and a thermoelectric conversion part which is provided below said photothermal conversion part and which converts the heat generated by said photothermal conversion part into an electric signal;
a selection part which selects some cells among said plurality of cells; and
an output part which outputs the electric signal generated by said thermoelectric conversion part of the selected cells,
wherein said photothermal conversion part includes:
a first photothermal conversion layer; and
a second photothermal conversion layer provided over and apart from said first photothermal conversion layer, which converts an infrared ray within a waveband different from the waveband of said first photothermal conversion layer into heat,
wherein said thermoelectric conversion part includes:
a first thermoelectric conversion part which converts the heat generated by said first photothermal conversion layer into the electric signal;
a second thermoelectric conversion part which is thermally separated from said first thermoelectric conversion part, and which converts the heat generated by said second photothermal conversion layer into the electric signal; and
a row selection line connected to said first and second thermoelectric conversion parts, which reads out the electric signal from the first and second thermoelectric conversion parts.

19. A thermal type infrared ray imaging element, comprising:
a plurality of cells arranged on a substrate each having a photothermal conversion part which converts an incident infrared ray into heat, and a thermoelectric conversion part which is provided below said photothermal conversion part and which converts the heat generated by said photothermal conversion part into an electric signal;
a selection part which selects some cells among said plurality of cells; and
an output part which outputs the electric signal generated by said thermoelectric conversion part of the selected cells,
wherein said photothermal conversion part has a plurality of photothermal conversion layers which convert infrared rays within different wavebands into heat, these photothermal conversion layers being disposed apart from each other in a vertical direction; and
said thermoelectric conversion part has:
a plurality of thermoelectric conversion parts which convert the heat generated by said plurality of photothermal conversion layers into the electric signals; and
a row selection line connected to said plurality of thermoelectric conversion parts, which reads out the electric signal from the plurality of thermoelectric conversion parts.

* * * * *